United States Patent
Roohparvar (10) Patent No.: US 7,508,708 B2
(45) Date of Patent: Mar. 24, 2009

(54) NAND STRING WITH A REDUNDANT MEMORY CELL

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 76 days.

(21) Appl. No.: 11/394,488

(22) Filed: Mar. 30, 2006

(65) Prior Publication Data

US 2007/0237011 A1 Oct. 11, 2007

(51) Int. Cl.
*G11C 16/06* (2006.01)

(52) U.S. Cl. .............................. 365/185.09; 365/185.17

(58) Field of Classification Search ............ 365/185.09, 365/185.17
See application file for complete search history.

(56) References Cited

U.S. PATENT DOCUMENTS

| | | | |
|---|---|---|---|
| 2004/0171218 A1* | 9/2004 | Kim et al. ................... | 438/266 |
| 2005/0024974 A1* | 2/2005 | Noguchi et al. ........ | 365/230.03 |
| 2005/0157578 A1* | 7/2005 | Noguchi et al. ........ | 365/230.03 |
| 2006/0018159 A1* | 1/2006 | Picca et al. ............ | 365/185.17 |
| 2006/0034137 A1* | 2/2006 | Zanardi ...................... | 365/200 |
| 2006/0120156 A1* | 6/2006 | Kawai et al. ........... | 365/185.17 |
| 2006/0203547 A1* | 9/2006 | Takeuchi ............... | 365/185.09 |
| 2006/0221730 A1* | 10/2006 | Park .......................... | 365/200 |

OTHER PUBLICATIONS

Tanaka, Tomoharu, "Multiple Level Cell Memory Device With Improved Reliability," (22 pages including drawings) U.S. Appl. No. 12/059,572, filed Mar. 31, 2008.

* cited by examiner

*Primary Examiner*—Thong Q Le
(74) *Attorney, Agent, or Firm*—Leffert Jay & Polglaze, P.A.

(57) ABSTRACT

The invention provides methods and apparatus. A NAND memory block has a source select line for selectively coupling one or more strings of series-coupled non-volatile memory cells to a source line, a drain select line for selectively coupling one or more strings of series-coupled non-volatile memory cells to one or more associated bit lines, a plurality of primary rows of memory cells interposed between the source select line and the drain select line and forming a portion of the one or more strings of series-coupled non-volatile memory cells, and one or more redundant rows of memory cells interposed between the source select line and the drain select line and forming a remaining portion of the one or more strings of series-coupled non-volatile memory cells.

56 Claims, 3 Drawing Sheets

NAND STRING WITH A REDUNDANT MEMORY CELL

TECHNICAL FIELD OF THE INVENTION

The present invention relates generally to memory devices and in particular the present invention relates to a NAND string with a redundant memory cell.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

In the event of a defective row, the whole string rows may become defective in that the rows of the string are connected in series. Therefore, in the event of a defective row, the entire memory block containing the defective row is typically replaced with a redundant memory block. However, it is not always practical to have multiple redundant memory blocks, especially in view of the tendency toward decreasing memory device sizes and thus memory array sizes. Moreover, as device sizes decrease, the spacing between adjacent rows (or word lines) of memory cells decreases and the spacing between adjacent bit lines of the memory array decreases, increasing the likelihood of row-to-row and bit-line-to-bit-line shorts.

For the reasons stated above, and for other reasons stated below which will become apparent to those skilled in the art upon reading and understanding the present specification, there is a need in the art for alternatives to existing NAND memory devices.

SUMMARY

The above-mentioned problems with NAND memory devices and other problems are addressed by the present invention and will be understood by reading and studying the following specification.

For one embodiment, the invention provides a NAND memory block having a source select line for selectively coupling one or more strings of series-coupled non-volatile memory cells to a source line, a drain select line for selectively coupling one or more strings of series-coupled non-volatile memory cells to one or more associated bit lines, a plurality of primary rows of memory cells interposed between the source select line and the drain select line and forming a portion of the one or more strings of series-coupled non-volatile memory cells, and one or more redundant rows of memory cells interposed between the source select line and the drain select line and forming a remaining portion of the one or more strings of series-coupled non-volatile memory cells.

For another embodiment, the invention provides a method of operating a NAND memory device including replacing one or more defective primary rows of non-volatile memory cells of a memory block with one or more redundant rows of non-volatile memory cells of the memory block. The one or more defective primary rows of non-volatile memory cells forms a portion of one or more strings of series-coupled non-volatile memory cells. The one or more redundant rows of non-volatile memory cells forms another portion of the one or more strings of series-coupled non-volatile memory cells.

For another embodiment, the invention provides a method of operating a NAND memory device including designating one or more first rows of non-volatile memory cells of a memory block as addressable rows, and designating a pair of second rows of non-volatile memory cells of the memory block as non-addressable rows when none of the first rows of non-volatile memory cells is defective. The one or more first rows of non-volatile memory cells forms a portion of one or more strings of series-coupled non-volatile memory cells. The second rows of non-volatile memory cells respectively form opposite end portions of the one or more strings of series-coupled non-volatile memory cells.

Further embodiments of the invention include methods and apparatus of varying scope.

DETAILED DESCRIPTION

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 1:
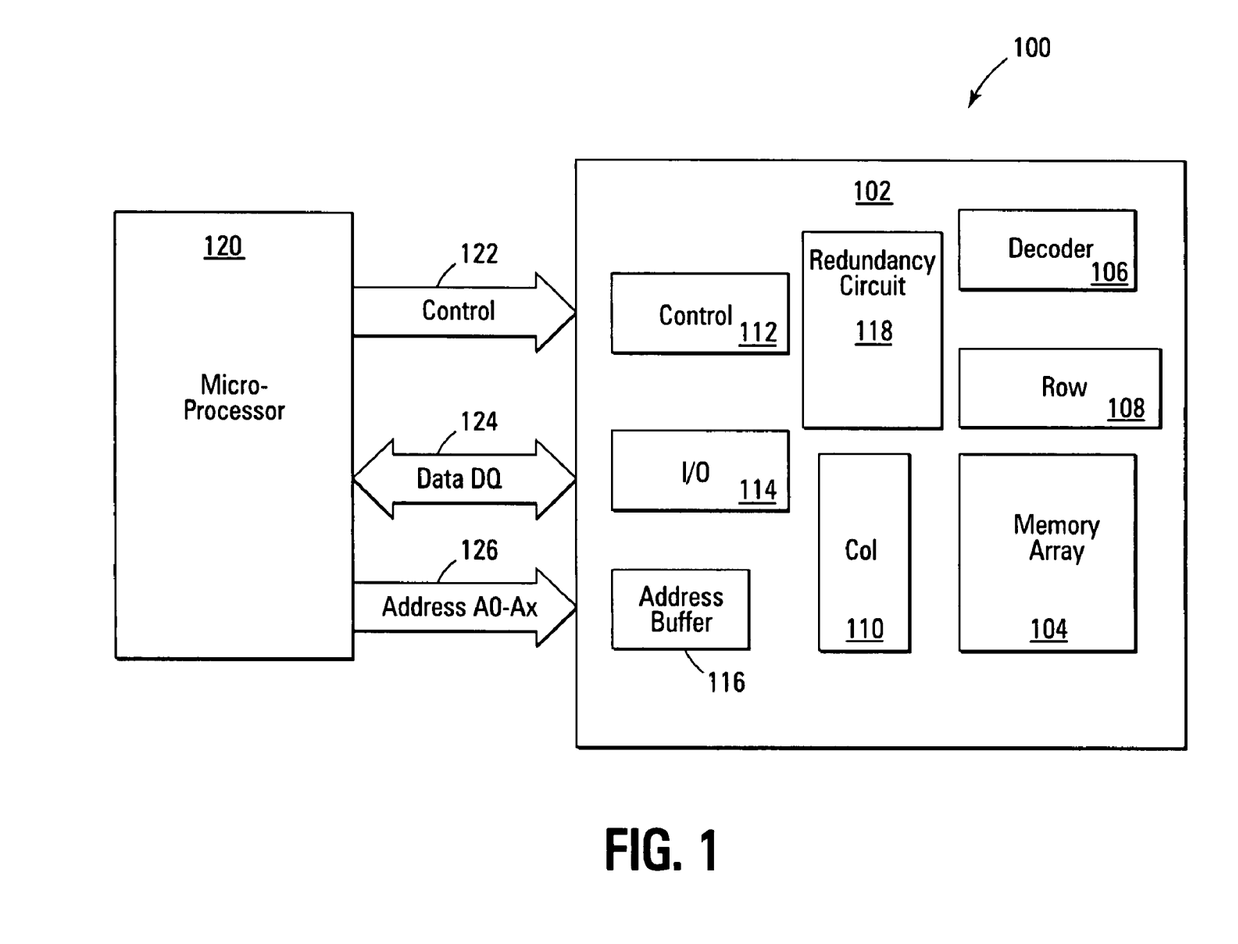
FIG. 1 is a block diagram illustration of a NAND memory device, according to an embodiment of the invention.

FIG. 1 is a block diagram illustration of a NAND memory device 102, according to an embodiment of the invention. The memory device 102 may be fabricated as semiconductor device on a semiconductor substrate. For one embodiment, memory device 102 includes an array of flash memory cells 104, an address decoder 106, row access circuitry 108, column access circuitry 110, control circuitry 112, Input/Output (I/O) circuitry 114, and an address buffer 116. Control circuitry 112 is adapted to perform operations of the invention.

Memory device also includes a redundancy circuit 118. In operation, column addresses are sent to column access circuitry 110 and to redundancy circuit 118, and row addresses are sent to row access circuitry 108 and to redundancy circuit 118. Redundancy circuit 118 respectively compares the column addresses and row addresses to addresses of defective primary columns and defective primary rows. When redundancy circuit 118 finds a match, it disables the defective row or column and replaces it with a corresponding redundant row or column.

Memory device 102 may be coupled to an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation. Columns of the array include strings of memory cells connected together in series, source to drain, between a pair of select lines. A plurality of primary rows of memory cells form a portion of the strings of memory cells, and one or more redundant rows of memory cells form a another portion of the strings of memory cells in accordance with embodiments of the invention. For one embodiment, the redundant rows are coupled to redundant circuitry 118.

Figure 2:
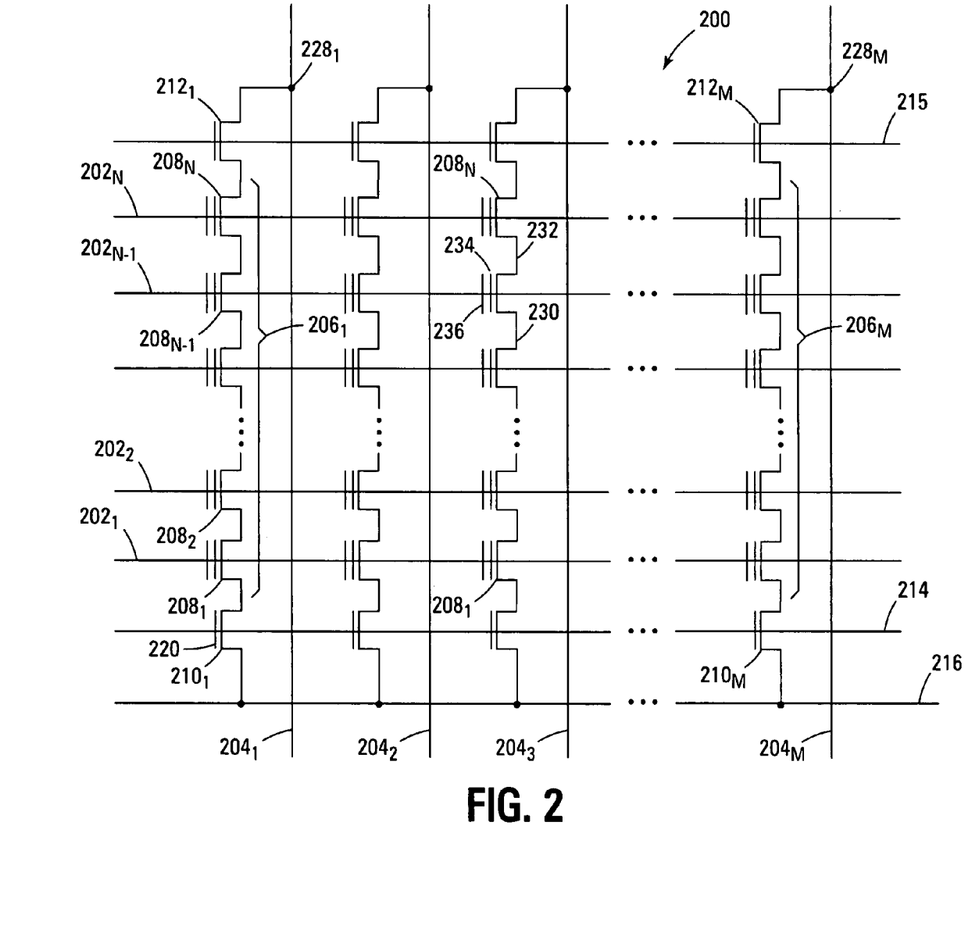
FIG. 2 is a schematic of a NAND memory array in accordance with another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting bit lines $204_1$ to $204_M$. Memory array 200 includes NAND strings $206_1$ to $206_M$. Each NAND string includes floating-gate transistors $208_1$ to $208_N$, each located at an intersection of a word line 202 and a bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

For one embodiment, one or more of the rows corresponding to the word lines 202, e.g., corresponding to word line $202_1$ and/or word line $202_N$ of NAND strings 206, are redundant rows, while the remaining rows, e.g., corresponding to word lines $202_2$ to word line $202_{N-1}$, are primary rows. For another embodiment, memory array 200 corresponds to a memory block of memory array 104 of FIG. 1, and includes one or more redundant rows in addition to the number of rows normally addressable in a memory block, such as 32 primary rows by 16,384 columns. A redundant row or memory cell may be defined as a row or memory cell that is not addressable unless a row of memory cells containing a primary memory cell is identified as defective.

Although the redundant row corresponding to word line $202_1$ is located adjacent the row of source select gates 210 and the memory cells 208 thereof are respectively coupled directly to the drains of source select gates 210 and the redundant row corresponding to word line $202_N$ is located adjacent the row of drain select gates 212 and the memory cells 208 thereof are respectively directly coupled to the sources of drain select gates 212, the redundant rows may be located between a pair of primary rows of memory cells with the memory cells 208 thereof respectively coupled in series with the memory cells of the pair of primary rows of memory cells for other embodiments. However, in the event of no defective primary rows, locating a redundant row of memory cells between a row of select gates and a primary row of memory cells acts to reduce the coupling effect of the select gates on the operation of a primary row of memory cells that would otherwise occur if the memory cells of that primary row of memory cells were respectively located directly adjacent the select gates.

In one embodiment, addresses of defective primary rows of memory cells, e.g., addresses of two or more primary rows of memory cells shorted together, are programmed in registers of redundancy circuit 118 of FIG. 1. Redundancy circuit 118 receives addresses of primary rows of memory cells from address decoder 106 of FIG. 1 and compares those addresses to the defective primary row addresses stored therein. For one embodiment, if an address of at least one of the primary rows of memory cells from address decoder 106 matches an address of one of the addresses of two or more primary rows shorted together, redundancy circuit 118 respectively drives the associated redundant row. That is, the primary row whose address matches a defective primary row address is disabled so that it is not responsive to the decoded address, and a match signal activates a corresponding redundant row in place of the primary row. For example, the address of the at least one of the primary rows may be the lowest address of the two or more primary rows shorted together and may have an indicator associated with it that indicates that the succeeding one or more primary rows with the next lowest addresses are shorted to the primary row with the lowest address of the two or more primary rows shorted together. Therefore, redundancy circuit 118 disables the primary row with the lowest address and activates a corresponding one of the redundant rows in place of the primary row with the lowest address. Redundancy circuit 118 also disables the one or more primary rows with the next lowest addresses and respectively activates corresponding redundant rows in place of the one or more primary rows with the next lowest addresses for one embodiment.

For another embodiment, if an address of at least one of the primary rows of memory cells from address decoder 106 matches an address of one of the addresses of two or more primary rows shorted together, the two or more primary rows shorted together are treated as a single row corresponding to one of the addresses of the two or more primary rows shorted together, e.g., the address of the at least one of the primary rows of memory cells from address decoder 106 that matches the address of one of the addresses of two or more primary rows shorted together. Redundancy circuit 118 then respectively replaces the remaining one or more primary rows shorted together with one or more corresponding redundant rows.

One problem related to NAND memory devices is the rows having memory cells located at the ends of the NAND strings and respectively connected directly to the source select gate and the drain select gate have different programming characteristics than those rows that are situated away from the ends. This is due to coupling effects between the end rows and their respective select lines.

For another embodiment, if none of the addresses of the primary rows of memory cells from address decoder 106 matches an address of a defective row, redundancy circuit 118 drives the memory cells, e.g., corresponding to word line $202_1$ of FIG. 2, located at one end of the NAND strings as unselected rows. Redundancy circuit 118 further drives the memory cells, e.g., corresponding to word line $202_N$, located at the other end of the NAND strings as unselected rows. Driving the rows respectively disposed at either end of the NAND strings as unselected rows acts to substantially reduce coupling effects between the end rows of memory cells and their respective select lines.

Figure 3:
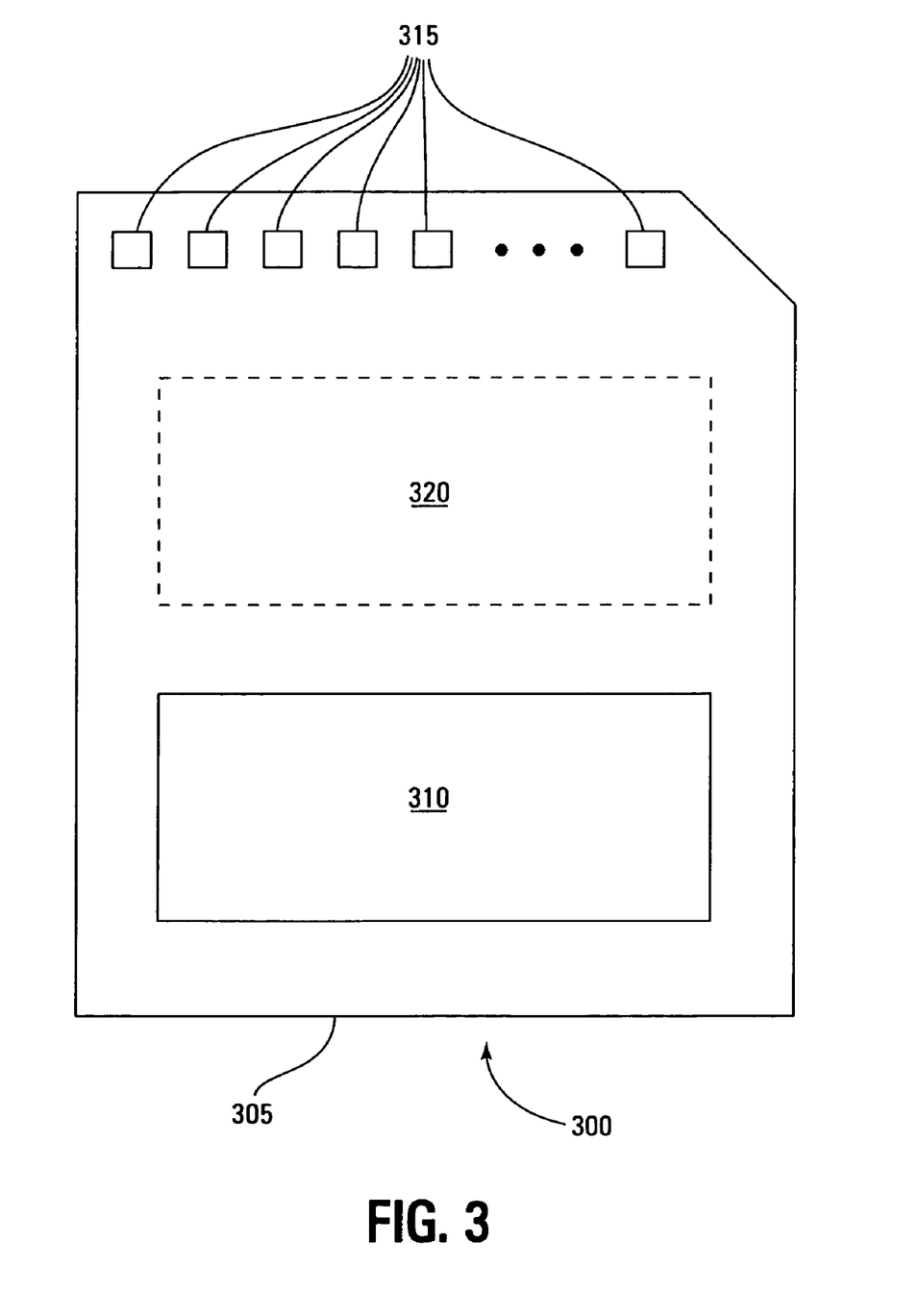
FIG. 3 is an illustration of an exemplary memory module, according to another embodiment of the invention.

FIG. 3 is an illustration of an exemplary memory module 300. Memory module 300 is illustrated as a memory card, although the concepts discussed with reference to memory module 300 are applicable to other types of removable or portable memory, e.g., USB flash drives, and are intended to be within the scope of "memory module" as used herein. In addition, although one example form factor is depicted in FIG. 3, these concepts are applicable to other form factors as well.

In some embodiments, memory module 300 will include a housing 305 (as depicted) to enclose one or more memory devices 310, though such a housing is not essential to all devices or device applications. At least one memory device 310 may be a NAND flash memory device, such as NAND memory device 102 of FIG. 1, having a memory array, such as memory array 200 of FIG. 2, in accordance with the invention. Where present, the housing 305 includes one or more contacts 315 for communication with a host device. Examples of host devices include digital cameras, digital recording and playback devices, PDAs, personal computers, memory card readers, interface hubs and the like. For some embodiments, the contacts 315 are in the form of a standardized interface. For example, with a USB flash drive, the contacts 315 might be in the form of a USB Type-A male connector. For some embodiments, the contacts 315 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 315 provide an interface for passing control, address and/or data signals between the memory module 300 and a host having compatible receptors for the contacts 315.

The memory module 300 may optionally include additional circuitry 320 which may be one or more integrated circuits and/or discrete components. For some embodiments, the additional circuitry 320 may include a memory controller for controlling access across multiple memory devices 310 and/or for providing a translation layer between an external host and a memory device 310. For example, there may not be a one-to-one correspondence between the number of contacts 315 and a number of I/O connections to the one or more memory devices 310. Thus, a memory controller could selectively couple an I/O connection (not shown in FIG. 3) of a memory device 310 to receive the appropriate signal at the appropriate I/O connection at the appropriate time or to provide the appropriate signal at the appropriate contact 315 at the appropriate time. Similarly, the communication protocol between a host and the memory module 300 may be different than what is required for access of a memory device 310. A memory controller could then translate the command sequences received from a host into the appropriate command sequences to achieve the desired access to the memory device 310. Such translation may further include changes in signal voltage levels in addition to command sequences.

The additional circuitry 320 may further include functionality unrelated to control of a memory device 310 such as logic functions as might be performed by an ASIC (application specific integrated circuit). Also, the additional circuitry 320 may include circuitry to restrict read or write access to the memory module 300, such as password protection, biometrics or the like. The additional circuitry 320 may include circuitry to indicate a status of the memory module 300. For example, the additional circuitry 320 may include functionality to determine whether power is being supplied to the memory module 300 and whether the memory module 300 is currently being accessed, and to display an indication of its status, such as a solid light while powered and a flashing light while being accessed. The additional circuitry 320 may further include passive devices, such as decoupling capacitors to help regulate power requirements within the memory module 300.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A NAND memory block, comprising:
   a source select line for selectively coupling one or more strings of series-coupled non-volatile memory cells to a source line;
   a drain select line for selectively coupling the one or more strings of series-coupled non-volatile memory cells to one or more associated bit lines;
   a plurality of primary rows of memory cells interposed between the source select line and the drain select line and forming a portion of the one or more strings of series-coupled non-volatile memory cells; and
   one or more redundant rows of memory cells interposed between the source select line and the drain select line and forming a remaining portion of the one or more strings of series-coupled non-volatile memory cells, wherein the second portion of one of the strings of series-coupled non-volatile memory cells in coupled in series with the first portion of that string of series-coupled non-volatile memory cells.

2. The NAND memory block of claim 1, wherein a first redundant row of the one or more redundant rows of memory cells further forms a first end portion of the one or more strings of series-coupled non-volatile memory cells.

3. The NAND memory block of claim 2, wherein a second redundant row of the one or more redundant rows of memory cells further forms a second end portion of the one or more strings of series-coupled non-volatile memory cells opposite the first end portion.

4. The NAND memory block of claim 1, wherein the one or more redundant rows of memory cells are addressable only if a primary row of memory cells is identified as defective.

5. The NAND memory block of claim 1, wherein the one or more redundant rows of memory cells is coupled to a redundancy circuit of a memory device.

6. A NAND memory block, comprising:
   a plurality of strings of series-coupled non-volatile memory cells, wherein the non-volatile memory cells are used to store data that is accessible by an external device;
   wherein each of the plurality of strings of series-coupled non-volatile memory cells contains a first number of primary memory cells coupled in series; and
   wherein at least one of the strings of series-coupled non-volatile memory cells contains one or more redundant memory cells coupled in series with the first number of primary memory cells.

7. The NAND memory block of claim 6, wherein the one or more redundant memory cells comprises a first redundant memory cell formed at one end of the at least one of the strings of series-coupled non-volatile memory cells.

8. The NAND memory block of claim 7, wherein the one or more redundant memory cells comprises a second redundant memory cell formed at an opposite end of the at least one of the strings of series-coupled non-volatile memory cells.

9. The NAND memory block of claim 6, wherein the one or more redundant memory cells of the at least one of the strings of series-coupled non-volatile memory cells are addressable only if a primary memory cell of the at least one of the strings of series-coupled non-volatile memory cells is identified as defective.

10. The NAND memory block of claim 6, wherein the first number of primary memory cells is equal to a number of addressable rows of the memory block.

11. A method of operating a NAND memory device, comprising:
    replacing one or more defective primary rows of non-volatile memory cells of a memory block with one or more redundant rows of non-volatile memory cells of the memory block;
    wherein the one or more defective primary rows of non-volatile memory cells form a first portion of one or more strings of series-coupled non-volatile memory cells; and
    wherein the one or more redundant rows of non-volatile memory cells form a second portion of the one or more strings of series-coupled non-volatile memory cells; and
    wherein the second portion of one of the strings of series-coupled non-volatile memory cells is coupled in series with the first portion of that string of series-coupled non-volatile memory cells.

12. The method of claim 11, wherein replacing one or more defective primary rows of non-volatile memory cells of a memory block with one or more redundant rows of non-volatile memory cells of the memory block further comprises:
    replacing two shorted together primary rows of the one or more defective primary rows with one of the one or more redundant rows; and
    operating the two shorted together primary rows as a single primary row.

13. The method of claim 11, wherein replacing one or more defective primary rows of non-volatile memory cells of a memory block with one or more redundant rows of non-volatile memory cells of the memory block further comprises replacing two shorted together primary rows of the one or more defective primary rows with two of the one or more redundant rows.

14. A NAND memory array, comprising:
    a plurality of memory blocks, each memory block comprising:
      a source select line for selectively coupling one or more strings of series-coupled non-volatile memory cells to a source line;
      a drain select line for selectively coupling the one or more strings of series-coupled non-volatile memory cells to one or more associated bit lines;
      a plurality of primary rows of memory cells interposed between the source select line and the drain select line and forming a portion of the one or more strings of series-coupled non-volatile memory cells; and
      one or more redundant rows of memory cells interposed between the source select line and the drain select line and forming a remaining portion of the one or more strings of series-coupled non-volatile memory cells, wherein the second portion of one of the strings of series-coupled non-volatile memory cells is coupled in series with the first portion of that string of series-coupled non-volatile memory cells.

15. The NAND memory array of claim 14, wherein for each memory block, a first redundant row of the one or more redundant rows of memory cells further forms a first end portion of the one or more strings of series-coupled non-volatile memory cells.

16. The NAND memory array of claim 15, wherein for each memory block, a second redundant row of the one or more redundant rows of memory cells further forms a second end portion of the one or more strings of series-coupled non-volatile memory cells opposite the first end portion.

17. The NAND memory array of claim 14, wherein for each memory block, the one or more redundant rows of memory cells is addressable only if a primary row of memory cells is identified as defective.

18. The NAND memory array of claim 14, wherein for each memory block, the one or more redundant rows of memory cells is coupled to a redundancy circuit of a memory device.

19. A NAND memory array, comprising:
a plurality of memory blocks, each memory block comprising:
a plurality of strings of non-volatile memory cells, each string of series-coupled non-volatile memory cells interposed between a source and drain select gate, wherein the non-volatile memory cells are used to store data that is accessible by an external device;
wherein each of the plurality of strings of series-coupled non-volatile memory cells contains a first number of primary memory cells coupled in series; and
wherein at least one of the strings of series-coupled non-volatile memory cells contains one or more redundant memory cells coupled in series with the first number of primary memory cells.

20. The NAND memory array of claim 19, wherein the one or more redundant memory cells comprise a first redundant memory cell formed at one end of the at least one of the strings of series-coupled non-volatile memory cells.

21. The NAND memory array of claim 20, wherein the one or more redundant memory cells comprise a second redundant memory cell formed at an opposite end of the at least one of the strings of series-coupled non-volatile memory cells.

22. The NAND memory array of claim 20, wherein the first redundant memory cell is coupled directly to the source select gate and the second redundant memory cell is coupled directly to the drain select gate.

23. A NAND memory block, comprising:
a plurality of strings of series-coupled non-volatile memory cells, wherein the non-volatile memory cells are used to store data that is accessible by an external device;
wherein each of the plurality of strings of series-coupled non-volatile memory cells comprises a number of memory cells that is greater than a number of addressable rows of the NAND memory block; and
wherein each of the strings of series-coupled non-volatile memory cells is disposed between a pair of select gates for selecting that string of series-coupled non-volatile memory cells.

24. A NAND memory block, comprising:
a plurality of strings of series-coupled non-volatile memory cells comprising a first number of primary rows of primary memory cells and a second number of redundant rows of redundant memory cells, each string of series-coupled non-volatile memory cells comprising the first number of primary memory cells coupled in series with the second number of redundant memory cells;
wherein the first number is greater than a number of addressable rows of the NAND memory block; and
wherein the second number is greater than or equal to one.

25. The NAND memory block of claim 24, wherein one of the redundant rows of memory cells is an end row adjacent a source select line of the NAND memory block.

26. The NAND memory block of claim 25, wherein another of the redundant rows of memory cells is an end row adjacent a drain select line of the NAND memory block.

27. A method of operating a NAND memory device, comprising:
designating one or more first rows of non-volatile memory cells of a memory block as addressable rows; and
designating a pair of second rows of non-volatile memory cells of the memory block as non-addressable rows when none of the first rows of non-volatile memory cells is defective;
wherein the one or more first rows of non-volatile memory cells form a first portion of one or more strings of series-coupled non-volatile memory cells;
wherein the second rows of non-volatile memory cells respectively form opposite end second portions of the one or more strings of series-coupled non-volatile memory cells; and
wherein the opposite end second portions of one of the strings of series-coupled non-volatile memory cells are coupled in series with the first portion of that string of series-coupled non-volatile memory cells.

28. A method of operating a NAND memory device, comprising:
comparing addresses of primary rows of non-volatile memory cells to addresses of primary rows of non-volatile memory cells that are defective; and
replacing a primary row of non-volatile memory cells with a redundant row of non-volatile memory cells when the address of the primary row of non-volatile memory cells matches an address of a primary row of non-volatile memory cells that is defective;
wherein the primary rows of non-volatile memory cells form a first portion of one or more strings of series-coupled non-volatile memory cells; and
wherein the redundant row of non-volatile memory cells forms a second portion of the one or more strings of series-coupled non-volatile memory cells; and
wherein the second portion of one of the strings of series-coupled non-volatile memory cells is couples in series with the first portion of that string of series-coupled non-volatile memory cells.

29. A NAND memory device, comprising:
an array of non-volatile memory cells;
control circuitry for control and/or access of the array of non-volatile memory cells;
wherein the array of non-volatile memory cells comprises one or more memory blocks, each memory block comprising:
a source select line for selectively coupling one or more strings of series-coupled non-volatile memory cells to a source line;
a drain select line for selectively coupling one or more strings of series-coupled non-volatile memory cells to one or more associated bit lines;
a plurality of primary rows of memory cells interposed between the source select line and the drain select line and forming a portion of the one or more strings of series-coupled non-volatile memory cells; and
one or more redundant rows of memory cells interposed between the source select line and the drain select line and forming a second portion of the one or more strings of series-coupled non-volatile memory cells, wherein the second portion of one of the strings of series-coupled non-volatile memory cells is coupled in series with the first portion of that string of series-coupled non-volatile memory cells; and a redundancy circuit coupled to the one or more redundant rows of memory cells for routing a defective primary row of memory cells to one of the one or more redundant rows of memory cells.

30. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells, wherein the non-volatile memory cells are used to store data that is accessible by an external device;

wherein each of the plurality of strings of series-coupled non-volatile memory cells comprises a number of memory cells that is greater than a number of addressable rows of the NAND memory block; and wherein each of the strings of series-coupled non-volatile memory cells is disposed between a pair of select gates for selecting that string of series-coupled non-volatile memory cells.

31. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells comprising a first number of primary rows of memory cells and a second number of redundant rows of memory cells, each string of series-coupled non-volatile memory cells comprising the first number of primary memory cells coupled in series with the second number of redundant memory cells;

wherein the first number is greater than a number of addressable rows of the NAND memory block; and wherein the second number is greater than or equal to one.

32. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a source select line for selectively coupling one or more strings of series-coupled non-volatile memory cells to a source line;

a drain select line for selectively coupling one or more strings of series-coupled non-volatile memory cells to one or more associated bit lines;

a plurality of primary rows of memory cells interposed between the source select line and the drain select line and forming a first portion of the one or more strings of series-coupled non-volatile memory cells; and at least first and second redundant rows of memory cells interposed between the source select line and the drain select line and respectively forming end second portions of the one or more strings of series-coupled non-volatile memory cells; wherein the end second portions of one of the strings of series-coupled non-volatile memory cells are coupled in series with the first portion of that string of series-coupled non-volatile memory cells; and a redundancy circuit coupled to the at least first and second redundant rows of memory cells for routing a defective primary row of memory cells to one of the one or more redundant rows of memory cells.

33. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells;

wherein each of the plurality of strings of series-coupled non-volatile memory cells contains a first number of primary memory cells coupled in series; and wherein at least one of the strings of series-coupled non-volatile memory cells contains one or more redundant memory cells coupled in series with the first number of primary memory cells.

34. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells, each string of series-coupled non-volatile memory cells interposed between a source and drain select gate;

wherein each of the plurality of strings of series-coupled non-volatile memory cells contains a first number of primary memory cells coupled in series; and wherein at least one of the strings of series-coupled non-volatile memory cells contains one or more redundant memory cells coupled in series with the first number of primary memory cells.

35. A NAND memory device, comprising:

an array of non-volatile memory cells;

control circuitry for control and/or access of the array of non-volatile memory cells;

wherein the array of non-volatile memory cells comprises one or more memory blocks, each memory block comprising:

a plurality of strings of non-volatile memory cells, each string of series-coupled non-volatile memory cells interposed between a source and drain select gate;

wherein each of the plurality of strings of series-coupled non-volatile memory cells contains a first number of primary memory cells coupled in series;

wherein at least one of the strings of series-coupled non-volatile memory cells contains one or more redundant memory cells coupled in series with the first number of primary memory cells;

wherein a first redundant non-volatile memory cell of the one or more redundant memory cells coupled in series with the first number of primary memory cells is coupled directly to the source select gate; and wherein a second redundant non-volatile memory cell of the one or more redundant memory cells coupled in series with the first number of primary memory cells is coupled directly to the drain select gate.

36. A memory module, comprising:
a plurality of contacts; and
two or more memory devices, each having access lines selectively coupled to the plurality of contacts;
wherein at least one of the memory devices comprises:
 an array of non-volatile memory cells;
 control circuitry for control and/or access of the array of non-volatile memory cells;
 wherein the array of non-volatile memory cells comprises one or more memory blocks, each memory block comprising:
  a source select line for selectively coupling one or more strings of series-coupled non-volatile memory cells to a source line;
  a drain select line for selectively coupling one or more strings of series-coupled non-volatile memory cells to one or more associated bit lines;
  a plurality of primary rows of memory cells interposed between the source select line and the drain select line and forming a first portion of the one or more strings of series-coupled non-volatile memory cells; and
  one or more redundant rows of memory cells interposed between the source select line and the drain select line and forming a second portion of the one or more strings of series-coupled non-volatile memory cells, wherein the second portion of one of the strings of series-coupled non-volatile memory cells is coupled in series with the first portion of that string of series-coupled non-volatile memory cells; and
  a redundancy circuit coupled to the one or more redundant rows of memory cells for routing a defective primary row of memory cells to one of the one or more redundant rows of memory cells.

37. A memory module, comprising:
a plurality of contacts; and
two or more memory devices, each having access lines selectively coupled to the plurality of contacts;
wherein at least one of the memory devices comprises:
 an array of non-volatile memory cells;
 control circuitry for control and/or access of the array of non-volatile memory cells;
 wherein the array of non-volatile memory cells comprises one or more memory blocks, each memory block comprising:
  a plurality of strings of series-coupled non-volatile memory cells;
  wherein each of the plurality of strings of series-coupled non-volatile memory cells comprises a number of memory cells that is greater than a number of addressable rows of the NAND memory block.

38. A memory module, comprising:
a plurality of contacts; and
two or more memory devices, each having access lines selectively coupled to the plurality of contacts;
wherein at least one of the memory devices comprises:
 an array of non-volatile memory cells;
 control circuitry for control and/or access of the array of non-volatile memory cells;
 wherein the array of non-volatile memory cells comprises one or more memory blocks, each memory block comprising:
  a plurality of strings of series-coupled non-volatile memory cells comprising a first number of primary rows of primary memory cells and a second number of redundant rows of redundant memory cells, each string of series-coupled non-volatile memory cells comprising the first number of primary memory cells coupled in series with the second number of redundant memory cells;
  wherein the first number is greater than a number of addressable rows of the NAND memory block; and
  wherein the second number is greater than or equal to one.

39. A memory module, comprising:
a plurality of contacts; and
two or more memory devices, each having access lines selectively coupled to the plurality of contacts;
wherein at least one of the memory devices comprises:
 an array of non-volatile memory cells;
 control circuitry for control and/or access of the array of non-volatile memory cells;
 wherein the array of non-volatile memory cells comprises one or more memory blocks, each memory block comprising:
  a source select line for selectively coupling one or more strings of series-coupled non-volatile memory cells to a source line;
  a drain select line for selectively coupling the one or more strings of series-coupled non-volatile memory cells to one or more associated bit lines;
  a plurality of primary rows of memory cells interposed between the source select line and the drain select line and forming a first portion of the one or more strings of series-coupled non-volatile memory cells; and
  at least first and second redundant rows of memory cells interposed between the source select line and the drain select line and respectively forming end second portions of the one or more strings of series-coupled non-volatile memory cells; wherein the end second portions of one of the strings of series-coupled non-volatile memory cells are coupled in series with the first portion of that string of series-coupled non-volatile memory cells; and
  a redundancy circuit coupled to the at least first and second redundant rows of memory cells for routing a defective primary row of memory cells to one of the one or more redundant rows of memory cells.

40. A memory module, comprising:
a plurality of contacts; and
two or more memory devices, each having access lines selectively coupled to the plurality of contacts;
wherein at least one of the memory devices comprises:
 an array of non-volatile memory cells;
 control circuitry for control and/or access of the array of non-volatile memory cells;
 wherein the array of non-volatile memory cells comprises one or more memory blocks, each memory block comprising:
  a plurality of strings of series-coupled non-volatile memory cells;
  wherein each of the plurality of strings of series-coupled non-volatile memory cells contains a first number of primary memory cells coupled in series; and wherein at least one of the strings of series-coupled non-volatile memory cells contains one or more redundant memory cells coupled in series with the first number of primary memory cells.

41. A memory module, comprising:
a plurality of contacts; and
two or more memory devices, each having access lines selectively coupled to the plurality of contacts;
wherein at least one of the memory devices comprises:
   an array of non-volatile memory cells;
   control circuitry for control and/or access of the array of non-volatile memory cells;
   wherein the array of non-volatile memory cells comprises one or more memory blocks, each memory block comprising:
      a plurality of strings of series-coupled non-volatile memory cells, each string of series-coupled non-volatile memory cells interposed between a source and drain select gate;
      wherein each of the plurality of strings of series-coupled non-volatile memory cells contains a first number of primary memory cells coupled in series; and
      wherein at least one of the strings of series-coupled non-volatile memory cells contains one or more redundant memory cells coupled in series with the first number of primary memory cells.

42. A memory module, comprising:
a plurality of contacts; and
two or more memory devices, each having access lines selectively coupled to the plurality of contacts;
wherein at least one of the memory devices comprises:
   an array of non-volatile memory cells;
   control circuitry for control and/or access of the array of non-volatile memory cells;
   wherein the array of non-volatile memory cells comprises one or more memory blocks, each memory block comprising:
      a plurality of strings of series-coupled non-volatile memory cells, each string of series-coupled non-volatile memory cells interposed between a source and drain select gate;
      wherein each of the plurality of strings of series-coupled non-volatile memory cells contains a first number of primary memory cells coupled in series;
      wherein at least one of the strings of series-coupled non-volatile memory cells contains one or more redundant memory cells coupled in series with the first number of primary memory cells;
      wherein a first redundant non-volatile memory cell of the one or more redundant memory cells coupled in series with the first number of primary memory cells is coupled directly to the source select gate; and
      wherein a second redundant non-volatile memory cell of the one or more redundant memory cells coupled in series with the first number of primary memory cells is coupled directly to the drain select gate.

43. A memory module, comprising:
a housing having a plurality of contacts; and
one or more memory devices enclosed in the housing and selectively coupled to the plurality of contacts;
wherein at least one of the memory devices comprises:
   an array of non-volatile memory cells;
   control circuitry for control and/or access of the array of non-volatile memory cells;
   wherein the array of non-volatile memory cells comprises one or more memory blocks, each memory block comprising:
      a source select line for selectively coupling one or more strings of series-coupled non-volatile memory cells to a source line;
      a drain select line for selectively coupling the one or more strings of series-coupled non-volatile memory cells to one or more associated bit lines;
      a plurality of primary rows of memory cells interposed between the source select line and the drain select line and forming a first portion of the one or more strings of series-coupled non-volatile memory cells; and
      one or more redundant rows of memory cells interposed between the source select line and the drain select line and forming a second portion of the one or more strings of series-coupled non-volatile memory cells, wherein the second portion of one of the strings of series-coupled non-volatile memory cells is coupled in series with the first portion of that string of series-coupled non-volatile membory cells; and
   a redundancy circuit coupled to the one or more redundant rows of memory cells for routing a defective primary row of memory cells to one of the one or more redundant rows of memory cells.

44. A memory module, comprising:
a housing having a plurality of contacts; and
one or more memory devices enclosed in the housing and selectively coupled to the plurality of contacts;
wherein at least one of the memory devices comprises:
   an array of non-volatile memory cells;
   control circuitry for control and/or access of the array of non-volatile memory cells;
   wherein the array of non-volatile memory cells comprises one or more memory blocks, each memory block comprising:
      a plurality of strings of series-coupled non-volatile memory cells;
      wherein each of the plurality of strings of series-coupled non-volatile memory cells comprises a number of memory cells that is greater than a number of addressable rows of the NAND memory block.

45. A memory module, comprising:
a housing having a plurality of contacts; and
one or more memory devices enclosed in the housing and selectively coupled to the plurality of contacts;
wherein at least one of the memory devices comprises:
   an array of non-volatile memory cells;
   control circuitry for control and/or access of the array of non-volatile memory cells;
   wherein the array of non-volatile memory cells comprises one or more memory blocks, each memory block comprising:
      a plurality of strings of series-coupled non-volatile memory cells comprising a first number of primary rows of primary memory cells and a second number of redundant rows of redundant memory cells, each string of series-coupled non-volatile memory cells comprising the first number of primary memory cells coupled in series with the second number of redundant memory cells;
      wherein the first number is greater than a number of addressable rows of the NAND memory block; and wherein the second number is greater than or equal to one.

46. A memory module, comprising:
a housing having a plurality of contacts; and
one or more memory devices enclosed in the housing and selectively coupled to the plurality of contacts;
wherein at least one of the memory devices comprises:
an array of non-volatile memory cells;
control circuitry for control and/or access of the array of non-volatile memory cells;
wherein the array of non-volatile memory cells comprises one or more memory blocks, each memory block comprising:
a source select line for selectively coupling one or more strings of series-coupled non-volatile memory cells to a source line;
a drain select line for selectively coupling the one or more strings of series-coupled non-volatile memory cells to one or more associated bit lines;
a plurality of primary rows of memory cells interposed between the source select line and the drain select line and forming a first portion of the one or more strings of series-coupled non-volatile memory cells; and
at least first and second redundant rows of memory cells interposed between the source select line and the drain select line and respectively forming end second portions of the one or more strings of series-coupled non-volatile memory cells; wherein the end second portions of one of the strings of series-coupled non-volatile memory cells are coupled in series with the first portion of that string of series-coupled non-volatile memory cells; and
a redundancy circuit coupled to the at least first and second redundant rows of memory cells for routing a defective primary row of memory cells to one of the one or more redundant rows of memory cells.

47. A memory module, comprising:
a housing having a plurality of contacts; and
one or more memory devices enclosed in the housing and selectively coupled to the plurality of contacts;
wherein at least one of the memory devices comprises:
an array of non-volatile memory cells;
control circuitry for control and/or access of the array of non-volatile memory cells;
wherein the array of non-volatile memory cells comprises one or more memory blocks, each memory block comprising:
a plurality of strings of series-coupled non-volatile memory cells;
wherein each of the plurality of strings of series-coupled non-volatile memory cells contains a first number of primary memory cells coupled in series; and
wherein at least one of the strings of series-coupled non-volatile memory cells contains one or more redundant memory cells coupled in series with the first number of primary memory cells.

48. A memory module, comprising:
a housing having a plurality of contacts; and
one or more memory devices enclosed in the housing and selectively coupled to the plurality of contacts;
wherein at least one of the memory devices comprises:
an array of non-volatile memory cells;
control circuitry for control and/or access of the array of non-volatile memory cells;
wherein the array of non-volatile memory cells comprises one or more memory blocks, each memory block comprising:
a plurality of strings of series-coupled non-volatile memory cells, each string of series-coupled non-volatile memory cells interposed between a source and drain select gate;
wherein each of the plurality of strings of series-coupled non-volatile memory cells contains a first number of primary memory cells coupled in series; and
wherein at least one of the strings of series-coupled non-volatile memory cells contains one or more redundant memory cells coupled in series with the first number of primary memory cells.

49. A memory module, comprising:
a housing having a plurality of contacts; and
one or more memory devices enclosed in the housing and selectively coupled to the plurality of contacts;
wherein at least one of the memory devices comprises:
an array of non-volatile memory cells;
control circuitry for control and/or access of the array of non-volatile memory cells;
wherein the array of non-volatile memory cells comprises one or more memory blocks, each memory block comprising:
a plurality of strings of series-coupled non-volatile memory cells, each string of series-coupled non-volatile memory cells interposed between a source and drain select gate;
wherein each of the plurality of strings of series-coupled non-volatile memory cells contains a first number of primary memory cells coupled in series;
wherein at least one of the strings of series-coupled non-volatile memory cells contains one or more redundant memory cells coupled in series with the first number of primary memory cells;
wherein a first redundant non-volatile memory cell of the one or more redundant memory cells coupled in series with the first number of primary memory cells is coupled directly to the source select gate; and
wherein a second redundant non-volatile memory cell of the one or more redundant memory cells coupled in series with the first number of primary memory cells is coupled directly to the drain select gate.

50. An electronic system, comprising:
a processor; and
one or more memory devices coupled to the processor, wherein at least one of the memory devices comprises:
an array of non-volatile memory cells;
control circuitry for control and/or access of the array of non-volatile memory cells;
wherein the array of non-volatile memory cells comprises one or more memory blocks, each memory block comprising:
a source select line for selectively coupling one or more strings of series-coupled non-volatile memory cells to a source line;
a drain select line for selectively coupling the one or more strings of series-coupled non-volatile memory cells to one or more associated bit lines;
a plurality of primary rows of memory cells interposed between the source select line and the drain select line and forming a forst portion of the one or more strings of series-coupled non-volatile memory cells; and one or more redundant rows of memory cells interposed between the source select line and the drain select line and forming a second portion of the one or more strings of series-coupled non-volatile memory cells, wherein the second portion of one of the strings of series-coupled non-volatile memory cells is coupled in series with the first portion of that string of series-coupled non-volatile memory cells; and a redundancy circuit coupled to the one or more redundant rows of memory cells for routing a defective primary row of memory cells to one of the one or more redundant rows of memory cells.

51. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells;

wherein each of the plurality of strings of series-coupled non-volatile memory cells comprises a number of memory cells that is greater than a number of addressable rows of the NAND memory block.

52. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells comprising a first number of primary rows of primary memory cells and a second number of redundant rows of redundant memory cells, each string of series-coupled non-volatile memory cells comprising the first number of primary memory cells coupled in series with the second number of redundant memory cells;

wherein the first number is greater than a number of addressable rows of the NAND memory block; and wherein the second number is greater than or equal to one.

53. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a source select line for selectively coupling one or more strings of series-coupled non-volatile memory cells to a source line;

a drain select line for selectively coupling the one or more strings of series-coupled non-volatile memory cells to one or more associated bit lines;

a plurality of primary rows of memory cells interposed between the source select line and the drain select line and forming a first portion of the one or more strings of series-coupled non-volatile memory cells; and at least first and second redundant rows of memory cells interposed between the source select line and the drain select line and respectively forming end second portions of the one or more strings of series-coupled non-volatile memory cells; wherein the end second portions of one of the string of series-coupled non-volatile memory cells are coupled in series with the first portion of that string of series-coupled non-volatile memory cells; and a redundancy circuit coupled to the at least first and second redundant rows of memory cells for routing a defective primary row of memory cells to one of the one or more redundant rows of memory cells.

54. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells;

wherein each of the plurality of strings of series-coupled non-volatile memory cells contains a first number of primary memory cells coupled in series; and wherein at least one of the strings of series-coupled non-volatile memory cells contains one or more redundant memory cells coupled in series with the first number of primary memory cells.

55. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells, each string of series-coupled non-volatile memory cells interposed between a source and drain select gate;

wherein each of the plurality of strings of series-coupled non-volatile memory cells contains a first number of primary memory cells coupled in series; and wherein at least one of the strings of series-coupled non-volatile memory cells contains one or more redundant memory cells coupled in series with the first number of primary memory cells.

56. An electronic system, comprising:

a processor; and one or more memory devices coupled to the processor, wherein at least one of the memory devices comprises:

an array of non-volatile memory cells;

control circuitry for control and/or access of the array of non-volatile memory cells;

wherein the array of non-volatile memory cells comprises one or more memory blocks, each memory block comprising:

a plurality of strings of series-coupled non-volatile memory cells, each string of series-coupled non-volatile memory cells interposed between a source and drain select gate;

wherein each of the plurality of strings of series-coupled non-volatile memory cells contains a first number of primary memory cells coupled in series;

wherein at least one of the strings of series-coupled non-volatile memory cells contains one or more redundant memory cells coupled in series with the first number of primary memory cells;

wherein a first redundant non-volatile memory cell of the one or more redundant memory cells coupled in series with the first number of primary memory cells is coupled directly to the source select gate; and wherein a second redundant non-volatile memory cell of the one or more redundant memory cells coupled in series with the first number of primary memory cells is coupled directly to the drain select gate.

* * * * *

UNITED STATES PATENT AND TRADEMARK OFFICE
CERTIFICATE OF CORRECTION

| | |
|---|---|
| PATENT NO. | : 7,508,708 B2 |
| APPLICATION NO. | : 11/394488 |
| DATED | : March 24, 2009 |
| INVENTOR(S) | : Roohparvar |

It is certified that error appears in the above-identified patent and that said Letters Patent is hereby corrected as shown below:

In column 7, line 27, in Claim 1, before "portion" insert -- first --.

In column 7, line 31, in Claim 1, delete "remaining" and insert -- second --, therefor.

In column 7, line 34, in Claim 1, after "cells" delete "in" and insert -- is --, therefor.

In column 8, line 58, in Claim 14, before "portion" insert -- first --.

In column 8, line 62, in Claim 14, delete "remaining" and insert -- second --, therefor.

In column 10, line 41, in Claim 28, after "cells;" delete "and".

In column 10, line 46, in Claim 28, delete "couples" and insert -- coupled --, therefor.

In column 10, line 59, in Claim 29, after "coupling" insert -- the --.

In column 10, line 64, in Claim 29, before "portion" insert -- first --.

In column 11, line 39, in Claim 31, before "memory" insert -- primary --.

In column 11, line 40, in Claim 31, before "memory" insert -- redundant --.

In column 13, line 19, in Claim 36, after "coupling" insert -- the --.

In column 16, line 22, in Claim 43, delete "membory" and insert -- memory --, therefor.

In column 17, line 30, in Claim 46, delete "portionsof" and insert -- portion of --, therefor.

UNITED STATES PATENT AND TRADEMARK OFFICE
CERTIFICATE OF CORRECTION

PATENT NO. : 7,508,708 B2
APPLICATION NO. : 11/394488
DATED : March 24, 2009
INVENTOR(S) : Roohparvar

It is certified that error appears in the above-identified patent and that said Letters Patent is hereby corrected as shown below:

In column 18, line 65, in Claim 50, delete "forst" and insert -- first --, therefor.

In column 20, line 14, in Claim 53, delete "string" and insert -- strings --, therefor.

Signed and Sealed this

Thirtieth Day of June, 2009

JOHN DOLL
*Acting Director of the United States Patent and Trademark Office*